(12) United States Patent
Rife

(10) Patent No.: US 6,304,451 B1
(45) Date of Patent: Oct. 16, 2001

(54) REVERSE MOUNT HEAT SINK ASSEMBLY

(75) Inventor: William B. Rife, Cranston, RI (US)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/624,529

(22) Filed: Jul. 24, 2000

Related U.S. Application Data
(60) Provisional application No. 60/168,410, filed on Dec. 1, 1999.

(51) Int. Cl.$^7$ .................................................... H05K 7/20
(52) U.S. Cl. ........................................................ 361/704
(58) Field of Search ............................ 361/700–710, 361/714–723, 732–737, 698–699; 257/706–727; 174/15.1, 15.2, 16.3, 252; 165/80.2, 80.3, 80.4, 185

(56) References Cited

U.S. PATENT DOCUMENTS

| | | | |
|---|---|---|---|
| Re. 35,573 | 7/1997 | Clemens | 257/719 |
| 2,432,513 | 12/1947 | Depew | 250/27.5 |
| 2,916,159 | 12/1959 | O'Neill | 211/89 |
| 2,958,515 | 11/1960 | Booher, II | 257/263 |
| 3,033,537 | 5/1962 | Brown, Jr. | 257/263 |
| 3,146,384 | 8/1964 | Ruehle | 317/234 |
| 3,182,114 | 5/1965 | Burgess et al. | 174/15 |
| 3,229,756 | 1/1966 | Keresztury | 165/67 |
| 3,417,300 | 12/1968 | Kauffman | 317/234 |
| 4,420,767 | * 12/1983 | Hodge et al. | 357/81 |
| 4,481,525 | 11/1984 | Calabro et al. | 357/81 |
| 4,576,224 | 3/1986 | Eaton et al. | 165/80.2 |
| 4,607,685 | 8/1986 | Mitchell, Jr. | 165/80.3 |
| 4,745,456 | 5/1988 | Clemens | 357/79 |
| 4,753,287 | 6/1988 | Horne | 165/80.3 |
| 4,802,532 | * 2/1989 | Dawes et al. | 165/80.3 |
| 4,924,352 | 5/1990 | Septfons | 361/388 |
| 5,170,323 | 12/1992 | Perretta et al. | 361/386 |
| 5,313,099 | 5/1994 | Tata et al. | 257/717 |
| 5,397,919 | 3/1995 | Tata et al. | 257/717 |
| 5,920,458 | * 7/1999 | Azar | 361/704 |

FOREIGN PATENT DOCUMENTS

360136348-A * 7/1985 (JP) ............................ H01L/23/36

* cited by examiner

Primary Examiner—Leo P. Picard
Assistant Examiner—Michael Datskovskiy
(74) Attorney, Agent, or Firm—Barlow, Josephs & Holmes

(57) ABSTRACT

A reverse mount heat dissipating device, for removing heat from an electronic device package, includes a circuit board with a bore therethrough. A semiconductor package is affixed to the top surface of the circuit board via a number of electrical contacts. The semiconductor package is positioned over the bore of the circuit board. A retaining collar is positioned in the bore of the circuit board. The retaining collar is secured in the bore in the circuit board by a circumferential groove and flanges. The retaining collar also includes a female threaded collar bore therethrough. A heat dissipating member, with a male threaded shank portion and a substantially flat top surface, is threadably received in the female threaded collar bore so that the flat top surface of the heat dissipating member is in flush thermal communication with the bottom surface of said semiconductor package. As a result, heat dissipation can be provided from a semiconductor package where mounting of a heat sink to the top of a semiconductor package is not possible.

15 Claims, 3 Drawing Sheets

REVERSE MOUNT HEAT SINK ASSEMBLY

This application claims benefit of Prov. No. 60/168,410 filed Dec. 1, 1999.

BACKGROUND OF THE INVENTION

The present invention relates generally cooling heat generating objects, such as electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages. Unlike a PENTIUM microprocessor with a PGA package, which has pins to be installed into a receiving socket, BGA and LGA semiconductor packages include an array of electrical contacts on their bottom surfaces to engage directly with an array of receiving electrical contacts on a circuit board, socket or the like. These semiconductor device packages are either soldered directly to a circuit board or positioned within a socket.

In similar fashion to the PENTIUM-type semiconductor devices discussed above, the BGA, LGA and related device packages also suffer from excessive generation of heat. If such heat is not properly dissipated, the chip will eventually fail. This is particular true when the semiconductor device is mounted on a circuit board in a cramped environment, such as in a laptop computer. In this environments, a balance must typically be made between the space available and the heat dissipation required for the semiconductor package. Typically, the space available above the semiconductor device to be cooled is very limited. As a result, a cooling solution cannot be provided on the top of the semiconductor package.

In light of the limited space above the semiconductor package, a cooling solution must be provided from below the heat generating semiconductor device package.

However, conventional heat sink assemblies cannot affix to the semiconductor package from below because the package is typically mounted on a circuit board and little room is provided to enable the tension of the heat sink assembly to be easily adjusted. For example, in the prior art, a heat sink assembly can be simply fastened to the bottom of the circuit board and into communication with the bottom a the semiconductor package via a pass through bore in the circuit board. This direct fastening does not permit adjustment the tension of the physical communication of the heat sink and the bottom of the semiconductor package to be easily adjust. This creates a risk that too much pressure will be provided causing the electrical mounting of the semiconductor package to the circuit board to be severed. Or, if too little pressure is provided, flush thermal communication of the heat sink to the bottom of the heat generating semiconductor package will not be achieved resulting is poor heat dissipation.

In view of the foregoing, there is a demand for a heat sink assembly that can achieve high thermal conductivity and heat dissipation. Further, there is a demand for a heat sink assembly that is compact and can be reverse mounted to the bottom of a heat generating semiconductor device package with a fully adjustable contact tension. Moreover, there is a demand for such a heat sink assembly that can be easily installed and manufactured at low cost. In additional, there is a demand for a reverse mount heat sink assembly that can be easily removed when desired.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling heat generating objects, such as microprocessor integrated circuit devices that cannot receive or accept heat sink assemblies mounted on the top-surfaces thereof. The heat sink assembly of the present invention enables the simple, easy and inexpensive assembly, use and maintenance of a heat sink assembly while realizing superior heat dissipation and the ability to dissipate heat from the bottom of the device.

The present invention provides a reverse mount heat dissipating device, for removing heat from an electronic device package, with a circuit board and a bore therethrough. A semiconductor package is affixed to the top surface of the circuit board via a number of electrical contacts. The semiconductor package is positioned over the bore of the circuit board. A retaining collar is positioned in the bore of the circuit board. The retaining collar is secured in the bore in the circuit board by a circumferential groove and flanges. The retaining collar also includes a female threaded collar bore therethrough. A heat dissipating member, with a male threaded shank portion and a substantially flat top surface, is threadably received in the female threaded collar bore so that the flat top surface of the heat dissipating member is in flush thermal communication with the bottom surface of said semiconductor package. As a result, heat dissipation can be provided from a semiconductor package where mounting of a heat sink to the top of a semiconductor package is not possible.

To install the reverse mount heat sink of the present invention, the retaining collar is first installed into the bore in the circuit board. The retaining collar is pressed through the circuit board where the flange about the leading free end of the collar is inwardly deflected to clear the bore of the circuit board. When fully inserted and the circuit board is cleared, the flange moves outwardly to secure the retaining collar to the periphery of the bore. The retaining collar is secured to the circuit board and serves as an anchor for receipt of the heat dissipating member. The male threaded shank of the heat dissipating member is threaded up into the female threaded bore of the retaining collar until the top flat surface of the shank of the heat dissipating member is in flush thermal communication with the bottom surface of the heat generating semiconductor device. The heat dissipating member is manually rotated to effectuate threading and, therefore, can be adjusted to control the overall tension of the contact of the heat dissipating member to the bottom of the semiconductor device package.

It is therefore an object of the present to provide a heat sink assembly that can accommodate a wide array of heat generating objects.

Another object of the present invention is to provide a heat sink assembly that is inexpensive and easy to install and manufacture.

It is a further object of the present invention to provide a heat sink assembly that can be reverse mounted to a semiconductor device package.

It is yet another object of the present invention to provide a heat sink assembly that is tension adjustable and can be easily removed.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
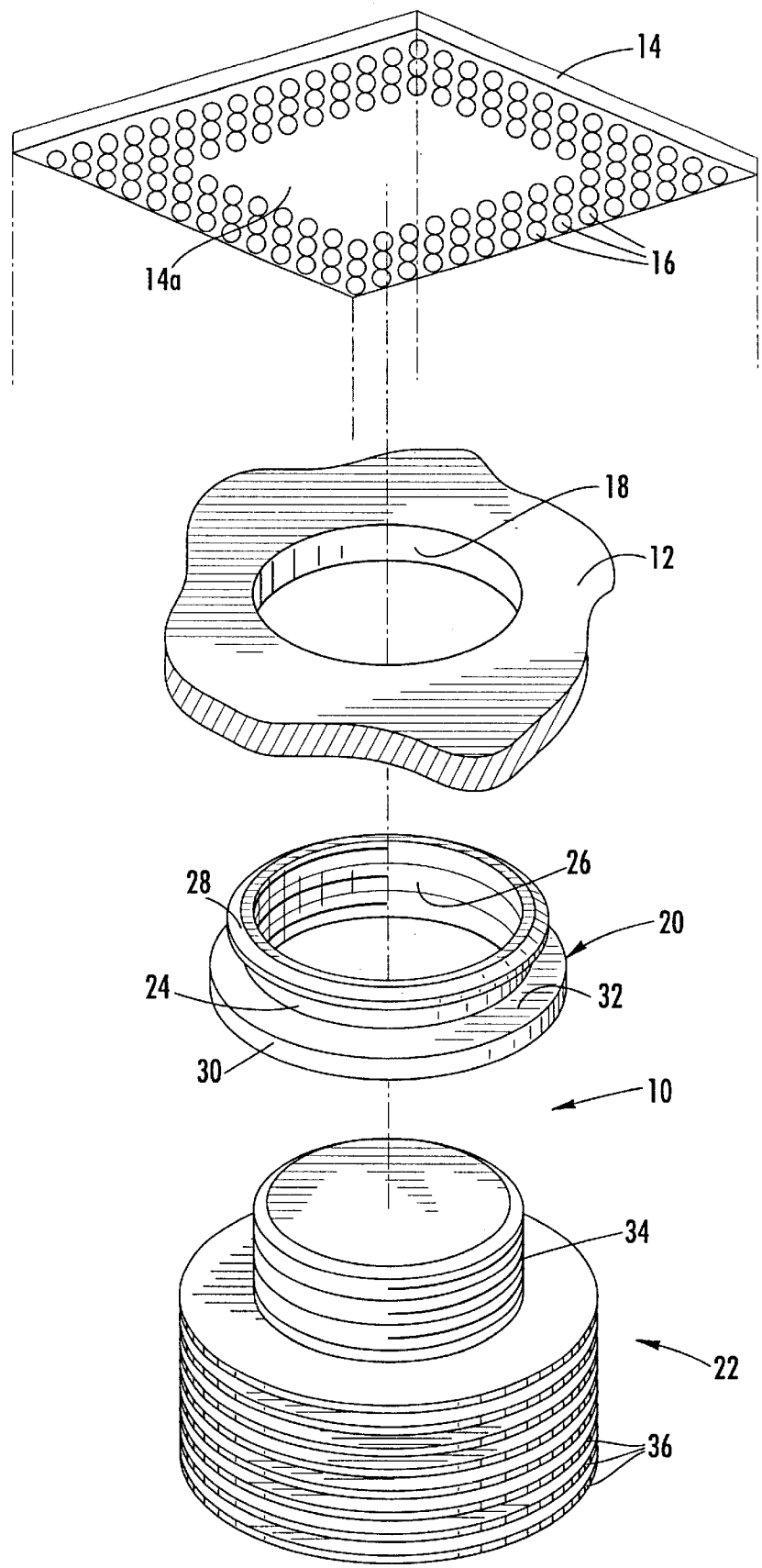
FIG. 1 is an exploded perspective view of the reverse mount heat sink assembly in accordance with the present invention being installed on a circuit board carrying a semiconductor package.
Figure 2:
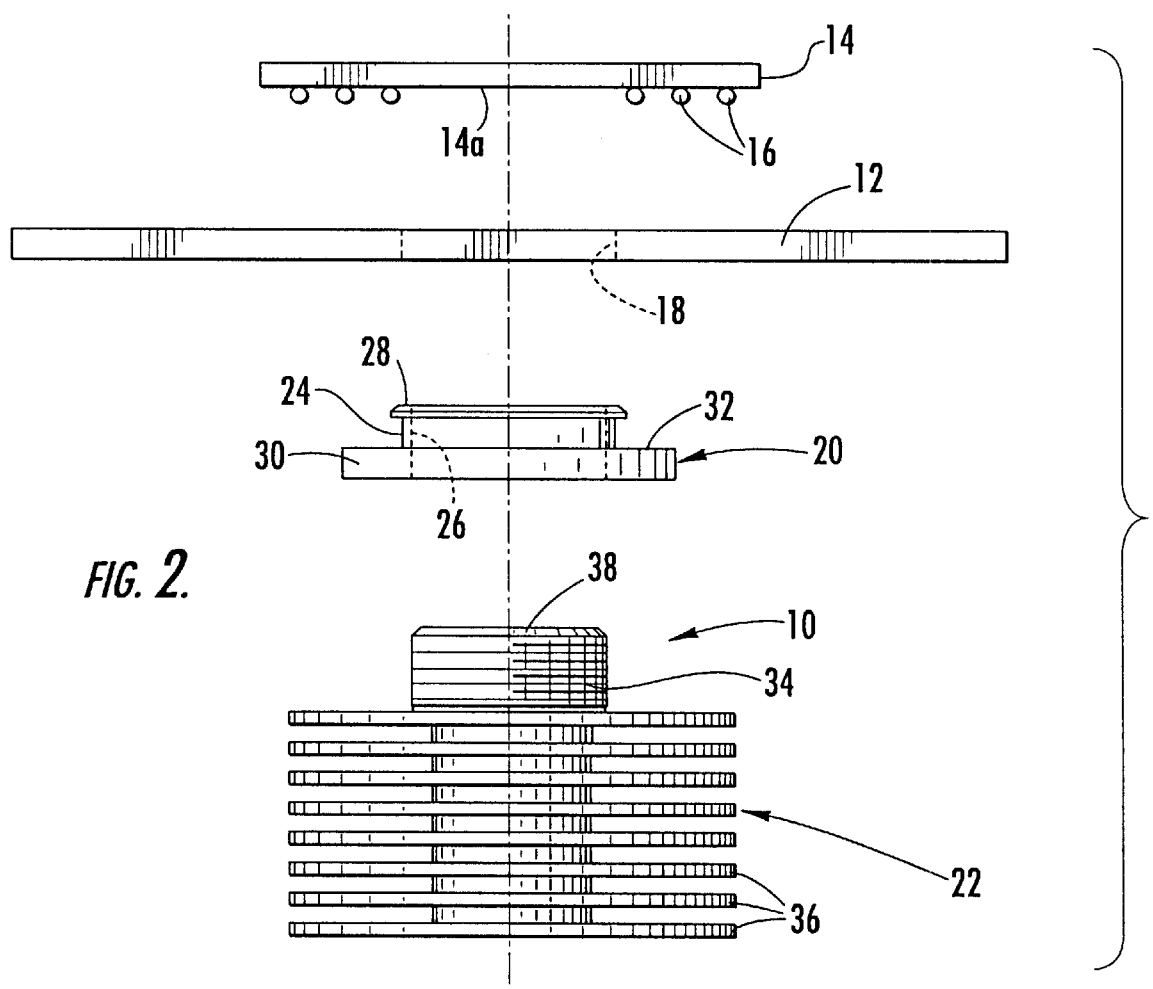
FIG. 2 is a exploded side elevational view of the reverse mount heat sink assembly of FIG. 1 installed on a circuit board carrying a semiconductor package.

Referring first to FIGS. 1 and 2, a perspective view and side elevational views of the reverse mount heat sink assembly 10 in accordance with the present invention are shown. A circuit board 12 is provided with a semiconductor package 14 with mounted thereon via an array of electrical connections 16. It should be understood that the present invention may be employed as a cooling solution for any type of heat generating surface or object. By way of example and for ease of illustration and discussion, the heat sink assembly 10 of the present invention is shown as providing a heat sink assembly 10 for a semiconductor device package 14 that is connected, both structurally and electrically, to the circuit board by a ball grid array 16. Other electrical and structural connections may be employed. The circuit board 12 also includes a pass through bore 18 which is preferably positioned directly below the semiconductor device package 14. The bore 18 is preferably located directly below the heat generating portion 14a of the semiconductor package 14 which may or may not be centrally located in the body of the semiconductor device package 14.

Still referring to FIGS. 1 and 2, the reverse mount heat sink assembly 10 itself includes a retaining collar 20 and a heat dissipating member 22. The retaining collar 20 includes a cylindrical wall 24 with a female threaded bore 26. An angled top flange 28 emanates from the top edge of the cylindrical wall 24 while a bottom flange 30 emanates from the bottom edge of the cylindrical wall 24. The angled top flange 28 and the bottom flange 30 form a circumferential groove 32 with the cylindrical wall 24 to be received in the bore 18 through the circuit board 12 as will be described in detail below. The heat dissipating member 22 includes a male threaded shank 34 and a number of heat dissipating elements 36, which are shown as fins, by way of example.

Figure 3:
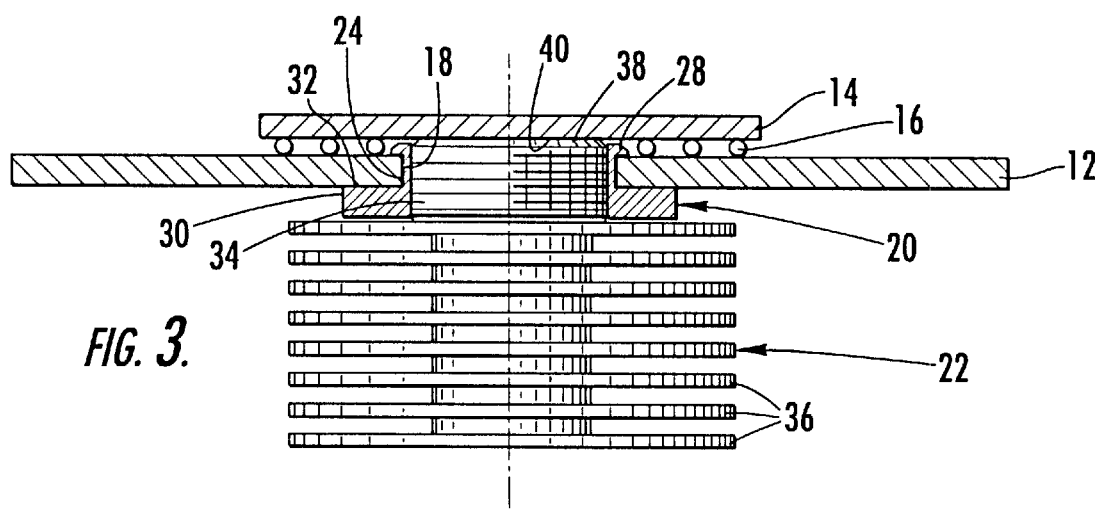
FIG. 3 is a partial cross-sectional view of the reverse mount heat sink assembly of FIG. 1 installed on a circuit board carrying a semiconductor package.

Turning now to FIG. 3, the assembly of the reverse mount heat sink assembly 10 in accordance with the present invention is shown. The retaining collar 20 is urged into the bore 18 in the circuit board 12 from below by inserting the retaining collar 20 with angled top flange 28 first. The angled top flange 28, which is preferably made of a compressible material, such as plastic, inwardly deflects to allow the retaining collar 20 to be inserted through the bore 18 in the circuit board 12. Upon further upward movement of the retaining collar 20, the angled top flange 28 clears the top of the circuit board 12 and the angled top flange 28 snaps outwardly so that the circuit board 12 periphery about the bore 18 in the circuit board 12 is embraced by the retaining collar 20, namely the groove 32 formed by the angled top flange 28, the cylindrical wall 24 and the bottom flange 30.

Once the retaining collar 20 is in place in the circuit board 12, the heat dissipating member 22 can now be installed. The male threaded shank 34 of the heat dissipating member 22 is threaded up into the retaining collar 20 by rotation thereof so that the top flat surface 38 of the male threaded shank 34 is in flush contact with the bottom surface 40 of the semiconductor device package 14. This flush contact provides the needed path for effective thermal transfer of heat from the heat generating semiconductor device package 14 to the heat dissipating member 22 which is facilitated by its fins. Manual rotation of the heat dissipating member 22 enables the tension of the contact to the bottom surface 40 of the semiconductor device package 14 to be finely adjusted to the needs of the particular installation. The manual adjustment is critical to ensure that the proper pressure and tension is applied to ensure full thermal transfer while preventing excessive pressure which could damage the semiconductor device package 14 and/or its connection to the circuit board 12.

In accordance with the present invention, a heat sink assembly 10 is be provided for a semiconductor device package 14 where it is not possible to attached such a heat sink assembly 10 to the top of the semiconductor device package 14. Further, the present invention enables a heat sink to be reverse mounted to a semiconductor device package 14 through a circuit board 12 that is not capable of providing a threaded bore due to limitations in the materials of the circuit board 12.

Figure 4:
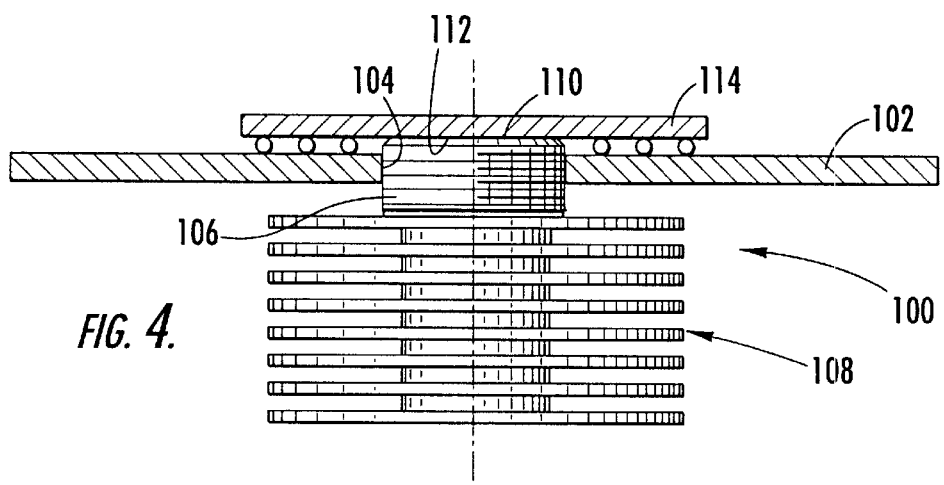
FIG. 4 is a partial cross-sectional view of a first alternative embodiment of the reverse mount heat sink assembly in accordance with the present invention.

Turning now to FIG. 4, a first alternative embodiment 100 of the present invention is shown. In this embodiment, a circuit board 102 is employed that is of material that can provide a female threaded bore 104 to receive the male threaded shank 106 of the heat dissipating member 108. In this embodiment, the male threaded shank 106 is threadable inserted into the female threaded bore 104 in the circuit board 102 itself so that the top flat surface 110 of the shank 106 is in flush thermal communication with the bottom surface 112 of the semiconductor device package 114 to be cooled.

Figure 5:
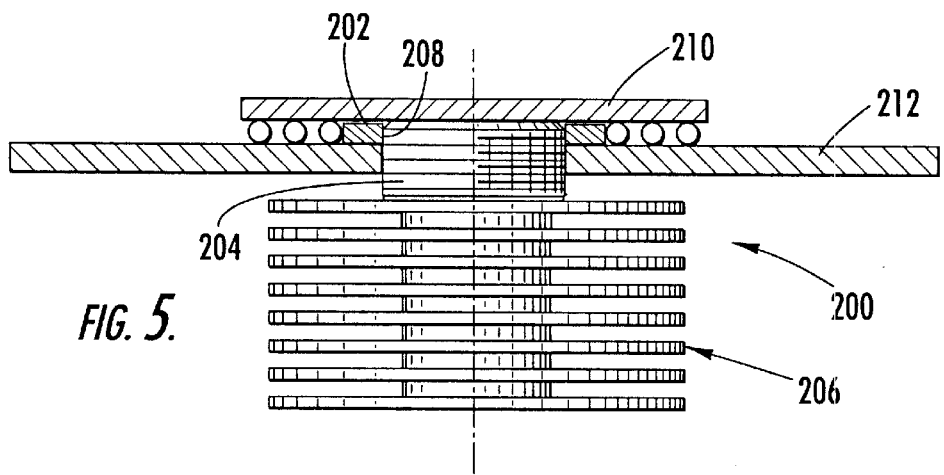
FIG. 5 is a partial cross-sectional view of a second alternative embodiment of the reverse mount heat sink assembly in accordance with the present invention.

In the second alternative embodiment 200 shown in FIG. 5, a retaining ring 202, instead of the retaining collar of FIGS. 1–3, is provided to serve as an anchor for threaded receipt of the male threaded shank 204 of the heat dissipating member 206. The retaining ring 202 includes a central bore 208 with female threading thereon. The retaining ring 202 is placed between the semiconductor device package 210 and the circuit board 212 prior to connection of the semiconductor device package 210 to the circuit board 212. As a result, the circuit board 212 and semiconductor device 210 package arrangement is now effectively provided with a threaded structure for receipt of the heat dissipating member 206 for controlled installation of a thermal solution.

Figure 6:
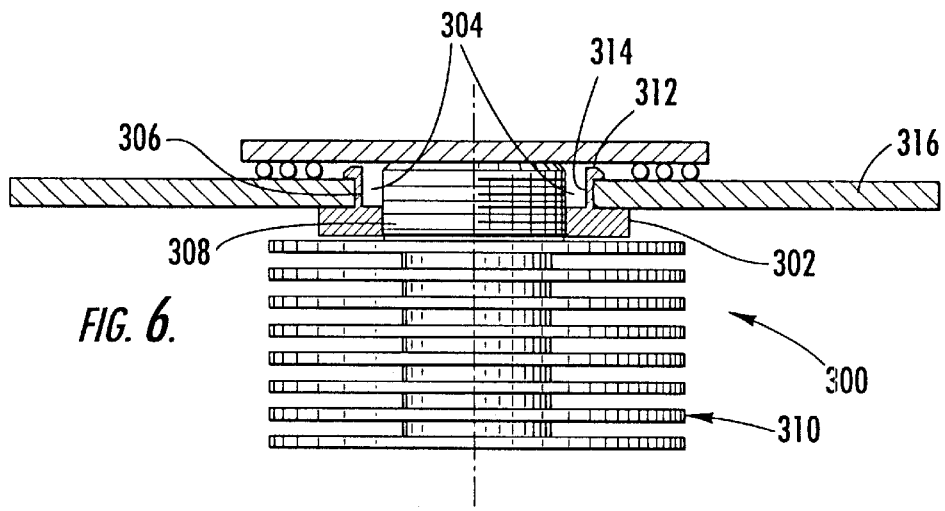
FIG. 6 is a partial cross-sectional view of a third alternative embodiment of the reverse mount heat sink assembly in accordance with the present invention.

Still further, FIG. 6 illustrates a third alternative embodiment 300 where a retaining collar 302 includes a space 304 between the cylindrical wall 306 and the threaded shank 308 of the heat dissipating member 310 to facilitate the inward deflection of the angled top flange 312 to permit clearance thereof during insertion through the bore 314 in the circuit board 316. In this embodiment, a stiffer, material may be employed than the compressible material of the preferred embodiment of FIGS. 1–3.

It is preferred that the retaining collar 20, 302 and retaining ring 202 be manufactured of a plastic material, such as a high temperature resistant and high creep resistant plastic for better withstanding the high temperatures associated with heat generating objects, such as microprocessors. For example, the plastic material for the retaining collar 20, 302 and retaining ring 202 may be LNP VERTON UF-700-10-HS (P.P.A. 50% long fiber) for use in high temperate heat sink applications. Alternatively, the retaining collar 20, 302 and retaining ring 202 may be manufactured of metal, such as aluminum, depending on the application. In addition, the heat dissipating member 22, 108, 206 and 310 is preferably metal, such as aluminum, for optimum thermal transfer and dissipation of heat from the device to be cooled. Alternatively, the heat dissipating member 22, 108, 206 and 310 may be made of a thermally conductive plastic depending on the application. The heat dissipating member 22, 108, 206 and 310 preferably includes a radial fin configuration as shown but various other heat sink fin configurations, such as a pin grid array, may be employed.

It should be understood that all of the threaded components of the present invention may include various types of threads which are envisioned and are deemed to be within the scope of the present invention. These various thread designs include continuous and interrupted threads. It is preferred that there be at least more than one turn to facilitate the adjustment of pressure. However, a single turn 360° thread, as well as half and quarter turn thread are considered to be within the scope of the present invention due to the ability to impart any desired pressure. Further, bayonet-type attachment methods, which engage with ramped notches within a bore, are also considered to be threads which can provide a gradual, hand-controllable pressure in accordance with the present invention.

It would be appreciated by those skilled in the art that various changes and modifications can be made to the illustrated embodiments without departing from the spirit of the present invention. All such modifications and changes are intended to be covered by the appended claims.

What is claimed is:

1. A heat dissipating device for removing heat from an electronic device package, comprising:

a circuit board having a top surface and a bottom surface; said circuit board defining a bore therethrough with a diameter;

a semiconductor package, having a top surface and a bottom surface, affixed to said top surface of said circuit board via a plurality of electrical contacts; said semiconductor package being positioned over said bore of said circuit board;

a retaining collar positioned in said bore of said circuit board; means connected to said retaining collar for securing said retaining collar in said bore of said circuit board; said retaining collar defining a female threaded collar bore therethrough; and a heat dissipating member having a male threaded shank portion with a substantially flat top surface adapted to be threadably received in said female threaded collar bore so that said flat top surface of said heat dissipating member is in flush thermal communication with said bottom surface of said semiconductor package.

2. The heat dissipating device of claim 1, wherein said means connected to said retaining collar for securing said retaining collar in said bore of said circuit board is a circumferential slot in said retaining collar engaged with said bore of said circuit board.

3. The heat dissipating device of claim 1, wherein said means connected to said retaining collar for securing said retaining collar in said bore of said circuit board is an upwardly extending wall having a top edge with an outwardly extending circumferential flange engaged with said bore of said circuit board; said outwardly extending circumferential flange extending beyond the diameter of said bore in said circuit board.

4. The heat dissipating device of claim 3, wherein said circumferential flange extends beyond the diameter of said bore in said circuit board.

5. The heat dissipating device of claim 4, wherein said upwardly extending wall is inwardly deflectable to permit clearance of said circumferential flange through said bore of said circuit board for installation of said retaining collar into said bore of said circuit board.

6. The heat dissipating device of claim 1, wherein said heat dissipating member includes a plurality of heat dissipating elements.

7. The heat dissipating device of claim 1, wherein said retaining collar is made of plastic.

8. The heat sink assembly of claim 1, wherein said flat top surface of said heat dissipating member is dimensioned to be substantially similar to said bottom surface of said semiconductor package.

9. A heat dissipating device for removing heat from an electronic device package, comprising:

a circuit board having a top surface and a bottom surface; said circuit board defining a bore therethrough with a diameter;

a semiconductor package, having a top surface and a bottom surface, affixed to said top surface of said circuit board via a plurality of electrical contacts; said semiconductor package being positioned over said bore of said circuit board;

a retaining collar positioned between said circuit board and said semiconductor package; said retaining collar defining a female threaded collar bore therethrough; and a heat dissipating member having a male threaded shank portion with a substantially flat top surface adapted to be routed through said bore in said circuit board and to be threadably received through said female threaded collar bore in said retaining collar so that said flat top surface of said heat dissipating member is in flush thermal communication with said bottom surface of said semiconductor package.

10. The heat dissipating device of claim 9, wherein said heat dissipating member includes a plurality of heat dissipating elements.

11. The heat dissipating device of claim 9, wherein said retaining collar is made of plastic.

12. The heat sink assembly of claim 9, wherein said flat top surface of said heat dissipating member is dimensioned to be substantially similar to said bottom surface of said semiconductor package.

13. A heat dissipating device for removing heat from an electronic device package, comprising:

a circuit board having a top surface and a bottom surface; said circuit board defining a female threaded bore therethrough with a diameter;

a semiconductor package, having a top surface and a bottom surface, affixed to said top surface of said circuit board via a plurality of electrical contacts; said semiconductor package being positioned over said bore of said circuit board;

a heat dissipating member having a male threaded shank portion with a substantially flat top surface adapted to be threadably received through said female threaded bore in said circuit board so that said flat top surface of said heat dissipating member is in flush thermal communication with said bottom surface of said semiconductor package.

14. The heat dissipating device of claim 13, wherein said heat dissipating member includes a plurality of heat dissipating elements.

15. The heat sink assembly of claim 13, wherein said flat top surface of said heat dissipating member is dimensioned to be substantially similar to said bottom surface of said semiconductor package.

* * * * *